(12) United States Patent
Wai Li et al.

(10) Patent No.: US 12,381,370 B2
(45) Date of Patent: Aug. 5, 2025

(54) TRANSISTOR OUTLINE HEADER FOR HIGH-SPEED DATA TRANSMISSION OF OPTOELECTRONIC APPLICATIONS

(71) Applicant: SCHOTT AG, Mainz (DE)

(72) Inventors: Ong Wai Li, Johor Bahru (MY); Jian Dean Tan, Singapore (SG); Amy Soon Li Ping, Singapore (SG); Andreas Krause, Vilsheim (DE); Artit Aowudomsuk, Bangkok (TH); Karsten Droegemueller, Eichenau (DE)

(73) Assignee: SCHOTT AG, Mainz (DE)

( * ) Notice: Subject to any disclaimer, the term of this patent is extended or adjusted under 35 U.S.C. 154(b) by 909 days.

(21) Appl. No.: 17/461,666

(22) Filed: Aug. 30, 2021

(65) Prior Publication Data

US 2022/0069544 A1    Mar. 3, 2022

(30) Foreign Application Priority Data

Sep. 3, 2020 (EP) .................................. 20194344

(51) Int. Cl.
*H01S 5/02212* (2021.01)
*H01S 5/02345* (2021.01)
(Continued)

(52) U.S. Cl.
CPC ...... *H01S 5/02345* (2021.01); *H01S 5/02212* (2013.01); *H01S 5/02415* (2013.01); *H01S 5/0683* (2013.01)

(58) Field of Classification Search
CPC ............. H01S 5/02345; H01S 5/02212; H01S 5/02415; H01S 5/0683; H01S 5/023;
(Continued)

(56) References Cited

U.S. PATENT DOCUMENTS 5,812,582 A * 9/1998 Gilliland ............. H01S 5/02257
372/50.21
6,506,624 B2   1/2003 Tatoh
(Continued)

FOREIGN PATENT DOCUMENTS

CN         1573387         2/2005
CN       103907249         7/2014
(Continued)

OTHER PUBLICATIONS

Baek, "High Sensitive 10-Gb/s APD Optical Receivers in Low-Cost TO-Can-Type Packages", IEEE Photonics Technology Letters, vol. 17, No. 1, Jan. 2005.

*Primary Examiner* — Xinning(Tom) Niu
(74) *Attorney, Agent, or Firm* — Ruggiero McAllister & McMahon LLC

(57) ABSTRACT

A header for opto-electronic applications is provided. The header includes a header base with a back face, a front face, and opening that extends from the back face through the base to the front face. The opening accommodates an electrically isolated pin through the opening. A pedestal is arranged at the front face and is below a center of the opening. The pedestal has a mounting face and a free face, which opposes the mounting face. The pedestal further includes an upper surface for mounting and carrying a pedestal submount. The mounting face is fixedly attached to the front face with an electrically conductive material that is at least partially arranged between the front face and the mounting face. An electrically isolating material is arranged in the opening between the base and the pin to electrically isolate the pin from the base.

15 Claims, 3 Drawing Sheets

(51) Int. Cl.
*H01S 5/024* (2006.01)
*H01S 5/0683* (2006.01)

(58) Field of Classification Search
CPC ..... H01S 5/0233; H01S 5/0235; H01L 23/10; H01L 23/04; H01R 13/02; H01R 13/03; H01R 13/502; H01R 13/646
See application file for complete search history.

(56) References Cited

U.S. PATENT DOCUMENTS

| | | | |
|---|---|---|---|
| 6,587,491 | B1 | 7/2003 | Yamamoto |
| 6,803,520 | B1 | 10/2004 | Musk |
| 11,973,311 | B2 | 4/2024 | Wang |
| 2002/0121863 | A1 | 9/2002 | Morishita |
| 2002/0131460 | A1 | 9/2002 | Chen |
| 2003/0165167 | A1* | 9/2003 | Ichikawa .............. H01L 24/78 372/36 |
| 2004/0144554 | A1 | 7/2004 | Reznik |
| 2004/0247004 | A1 | 12/2004 | Keh |
| 2005/0089070 | A1* | 4/2005 | Honda .............. H01S 5/02212 372/36 |
| 2005/0121684 | A1 | 6/2005 | Aruga |
| 2005/0232322 | A1* | 10/2005 | Bessho .............. H01S 5/4043 372/43.01 |
| 2006/0176918 | A1 | 8/2006 | Aruga |
| 2006/0198600 | A1 | 9/2006 | Oomori |
| 2006/0251138 | A1* | 11/2006 | Hata .............. B82Y 20/00 |
| 2006/0281202 | A1 | 12/2006 | Ishida |
| 2007/0228535 | A1 | 10/2007 | Fujino |
| 2008/0118251 | A1 | 5/2008 | Itamoto |
| 2008/0245545 | A1 | 10/2008 | Bjorn |
| 2009/0067469 | A1 | 3/2009 | Sato |
| 2011/0235980 | A1 | 9/2011 | Sato |
| 2014/0241388 | A1 | 8/2014 | Yamanaka |
| 2018/0145003 | A1 | 5/2018 | Shirasaki |
| 2019/0036298 | A1 | 1/2019 | Fujimura |
| 2019/0074658 | A1 | 3/2019 | Jungwirth |
| 2020/0067265 | A1 | 2/2020 | Hettler |
| 2020/0192038 | A1 | 6/2020 | Noguchi |
| 2020/0203922 | A1 | 6/2020 | Zhang |
| 2020/0243992 | A1 | 7/2020 | Annequin |
| 2021/0057878 | A1 | 2/2021 | Oomori |
| 2021/0305472 | A1 | 9/2021 | Kimura |

FOREIGN PATENT DOCUMENTS

| | | |
|---|---|---|
| CN | 107508141 | 12/2017 |
| CN | 108075350 | 5/2018 |
| CN | 108988120 | 12/2018 |
| CN | 110808491 | 2/2020 |
| CN | 111509501 | 8/2020 |
| EP | 3627545 | 3/2020 |
| FR | 2918509 | 1/2009 |
| JP | 2000353846 | 12/2000 |
| JP | 2003163512 | 6/2003 |
| JP | 2004063852 | 2/2004 |
| JP | 2005045234 | 2/2005 |
| JP | 2008124351 | 5/2008 |
| JP | 2011203458 | 10/2011 |
| JP | 2018165784 | 10/2018 |
| JP | 2020053565 | 4/2020 |
| JP | 2021153100 | 9/2021 |
| WO | 2019225128 | 11/2019 |
| WO | 2020111257 | 6/2020 |

* cited by examiner

TRANSISTOR OUTLINE HEADER FOR HIGH-SPEED DATA TRANSMISSION OF OPTOELECTRONIC APPLICATIONS

CROSS REFERENCE TO RELATED APPLICATIONS

This application claims benefit under 35 USC § 119 of European Application 20 194 344.6 filed Sep. 3, 2020, the entire contents of which are incorporated herein by reference.

BACKGROUND

1. Field of the Invention

The invention generally relates to the packaging of electronic components. In particular, the invention relates to the design of a header, preferably a transistor outline header (TO-header) for mounting an electronic device. The invention is particularly suitable for laser diodes as electronic devices.

2. Description of Related Art

For some opto-electronic applications, the wavelengths of the beam emitted by the laser chip must be controlled precisely. As the wavelength of the laser is temperature dependent. Therefore, the temperature of the laser should be stabilized within a narrow temperature range. To achieve this, it is known to use a thermo-electric cooler (TEC). The TEC may be included within the housing for the laser diode, such as a transistor outline (TO) package. TECs may be used in tandem with directly modulated Lasers (DML) for mid-range distances. The DML is lower in costs as external modulated laser (EML). However, many laser driver ICs are driving the DML with differential signals. In this case, the header needs two RF signal lines. These two signal lines should preferably have a characteristic impedance $Z_0=25$ Ohm to avoid signal degradation from reflections others then from the DML.

Further, the TEC has a hot and a cold side. The hot side is connected to the header for heat dissipation. The DML is mounted on the cold side. The cold side should be thermally isolated from the hot side to prevent thermal feedback and a self-heating effect. On the other hand, two RF lines must be connected to the DML. One well known concept is to use two separate RF lines. Each RF line comprises a small printed wire board to bring the signal to the DML inside the header. Each printed wire board may be mounted on a separate pedestal. The eyelet or base of the header comprises several openings for accommodating pins, for example, to electrically connect the printed wire board to a respective pedestal. That is, each pedestal corresponds to a respective opening. Typically, the pedestals and the eyelet or base of the header are made in one stamping process as one piece. The stamping, however, causes an edge at the connection area between the header and the pedestal. Such edges are angled to the top face of the pedestal, where the printed wire boards are mounted on, leading to a small offset between the header and the printed wire boards. Those offsets have a significant negative influence on the RF performance, in particular cause a significant loss in dB.

Moreover, in current designs, the RF line may be a ground referenced microstrip line with the signal line on the top side and the ground on the bottom side of the printed wire board, which is placed on a pedestal that is electrically connected with the ground. To connect the DML mounted on a carrier on the cold side of the TEC bond wires are used, because of their very low thermal conductivity. To get access to the ground for the bond wire interconnection, two through hole vias, may be used in each printed wire board. The vias provide interconnection from the bottom side to the top side of the printed wire board. Using two vias enable a bond wire configuration of ground-signal-ground (GSG) which has much better RF performance as the simple ground-signal configuration. However, vias need additional production steps and complicate the overall design, as the printed wire boards and the pedestals should have compatible designs.

Therefore, it is an object of the invention to provide a design for a header, which facilitates the assembly, e.g. by avoiding, offsets and vias and nevertheless provides an improved RF-performance.

SUMMARY

Accordingly, a header for opto-electronic applications comprises a header base extending in a height, a width and a longitudinal direction. The base comprises a base back face and a base front face as well as at least one, preferably at least two openings that extend from the base back face through the volume of the base and along the width direction to the base front face to accommodate at least one electrically isolated pin per opening. The pin/s is/are plugged through the opening/s, or extend through the opening/s, respectively. At least a first pedestal is arranged at the base front face, wherein the pedestal is placed in height direction below a center of an opening and comprises at least a pedestal mounting face and a pedestal free face, which opposes the pedestal mounting face. The pedestal further comprises at least one surface for mounting and carrying a pedestal submount. This surface is in the following referred to the upper surface. The pedestal mounting face of the pedestal is fixedly attached to the base front face with an electrically conductive material that is at least partially arranged between the base front face and the pedestal mounting face. An electrically isolating material, e.g. glass is arranged in the opening and in particular between the base and the pin to guarantee, that the pin is electrically isolated from the base.

Contrary to base and pedestal that are made of one piece, with a pedestal that is attached to the base it is possible to adjust the position of the pedestal to a desired place on the base. Beneficially, that place may be closer to the eyelets or openings of the base than is possible in conventional designs, where pedestals are stamped out of the base. Ideally, at least one pedestal, in particular more than one, may be arranged overlapping at least partially the opening, so that a submount can be placed on the upper surface and in particular in direct contact to the pin. That way, an offset between pin and submount can be avoided and therefore, the RF-performance will be improved. Moreover, as the pedestal is not stamped, the edge between the pedestal and the base is not existent. Thus, the upper surface of the pedestal may be arranged in contact to the base front face, so that a submount is mountable without an offset and/or in particular in direct contact to the base front face.

To provide an improved electrical contact and to enable an electric interconnection between the pedestal and the base, the base and/or the pedestal are made of electrically conducting materials, in particular of a metallic material. Preferably, the mounting face of the pedestals faces, and in particular is fixedly attached to the base front face with an electrically conductive material that may comprise Au, in particular a metallic alloy comprising Au and other metals, e.g. Sn or Ge. Ideally, the electrically conductive material is a solder or braze material to guarantee an improved fixation as well as an electric conduction of the base and pedestal. Therefore, the mounting face is preferably fixedly attached to the base front face at a brazing area or solder joint, and in particular is fixed onto the base front face with solder.

The pedestal or one or more faces of the pedestal is coated or plated at least partially with an electrically conducting material, in particular a metallic material and preferably a metallic material comprising Au and/or one or more components similar to a component of the solder or braze material. That way the plated or coated pedestal may provide a support to the fixation process of the base and the pedestal.

In one aspect, at least one of the pedestals has a cuboid or prismatic shape, with three, five or e.g. six faces. Preferably, the pedestal is shaped cuboidal with at least two side faces, a mounting face and a free face enclosing the upper surface. A cuboid or prismatic shape is easy to produce and provide at least one face, where the submount can be placed on. The upper surface may therefore be flat, and in particular a plane face to guarantee a secure seat on the pedestal. Ideally, the free face opposes the mounting face, which may also be fabricated flat to achieve a gapless mounting on the base front face and in particular a well conducting performance. Further, the mounting face and the free face and/or the two side faces are arranged in parallel. If the pedestal has prismatic shape, the side faces may be arranged in an angle, e.g. an acute angle or an obtuse angle. All edges or single edges of the pedestal may be formed sharp or rounded. The pedestal may also comprise a bottom face, which may be arranged adjacent to at least one side face, the mounting surface and/or the free face.

According to one aspect of the invention, the header comprises a second pedestal, wherein the first and second pedestals are arranged mirror symmetrically with respect to an imaginary plane parallel to the height and width direction. Preferably, the pedestals are arranged mirror symmetrically with the side faces face each other, and in particular with the upper surfaces arranged coplanar. That way, the TEC and the DML or EML can be placed best between the pedestals, and preferably between the RF lines, which are represented by the pedestals and the submounts mounted thereon. Further, with a coplanar arrangement of the RF lines a signal degradation is reduced.

In a preferred embodiment, the first and second pedestals are of equal shape having two end faces and are mounted to the base with opposite end faces. In this embodiment the end faces of each pedestal represent the mounting face and the free face. At best, a shape of the first and second pedestal correspond to each other. The first and/or second pedestal may further be shaped mirror symmetrically with respect to at least a mirror plane parallel to the longitudinal and height direction. It is further possible, that the first and/or second pedestal are further be shaped mirror symmetrically with respect to at least one of the mirror planes parallel to the width and height direction or parallel to the longitudinal and width direction. In other words, at least one cross-sectional shape of each pedestal is formed mirror symmetrically. Simple constructions, such as for example symmetrical structures of pedestals are much easier to produce than complex structures and most possibly compatible to many different bases, enabling a broad range of applications of the pedestals.

In another embodiment, the upper surface of each pedestal is connected to the free and/or mounting face by an edge, wherein the edge is arranged adjacent to and between the upper surface and the mounting and/or free face, wherein: the edge is formed as a chamfer edge, or the edge is formed as a blend edge.

To keep a symmetrical shape of the pedestal, the blend or chamfer edge is arranged at both ends of the pedestal. However, it may be possible, that the blend or chamfer edge is arranged at one end of the pedestal, e.g. adjacent to the mounting face. The pedestal is intended to be fixed to the base front face by using solder. Typically, excess solder forms a bulge around the profile of the pedestal. A blend or chamfer edge provide a reservoir for the excess solder, so that the submount can be mounted flat on the upper surface and in particular the submount can be placed without an offset and in direct contact to the base front face. Preferably, an edge surface of the blend or chamfer edge is arranged to the upper surface, the mounting face and/or the free face in an obtuse angle, ideally, in angle between 100° and 160°. The reservoir, which is formed by the blend or chamfer edge, and which is positioned between the base front face, the upper surface and the edge surface may be large enough to accommodate the whole mass of excess solder. It is further possible, that the pedestal is positioned at the base front face such that the reservoir and or the blend or chamfer edge is arranged overlapping at least a part of an eyelet/opening to provide a precise adjustment of the submount with a minimum space of the submount to the pin and/or the base front face. It may be possible that one of the pedestals comprise a chamfer edge, while another pedestal comprises a blend edge.

In another aspect of the invention, the first and second pedestal comprise a first bar, which is arranged at the upper surface such that a side face of the first bar extends a first side face of the first and second pedestal to form a sidewall adjacent to the upper surface. The first bar and the upper surface form an L-shape of the first and second pedestal. Therefore, a cross-sectional profile along the height and longitudinal direction has an L-shape. The bar is preferably situated between the upper surface and the side face of the pedestal, and ideally extends over the whole width in width direction of the pedestal and, in particular over the whole width of the upper surface. In other words, a length of the bar resembles the width of the upper surface, wherein the length of the bar is arranged perpendicular to the longitudinal direction and parallel to the width direction. It may be possible that a length of the bar is shorter or larger than the width of the upper surface, especially in a case, where the length of the bar resembles a width of the upper surface and a width of at least one blend or chamfer edge. The sidewall may be defined as an inner surface of the bar, which in particular opposes the side face of the bar, and more preferably is arranged in parallel to the side face of the bar. The bar further may comprise a top face, which is ideally arranged on top of the bar and adjacent to the sidewall and the side face of the bar, wherein edges between the top face and the sidewall and/or side face may be rounded or sharp. Preferably, the bar further has a rectangular cross section.

Ideally, the bar and the pedestal are made of one piece and/or comprise the same material. That way the bar provides a ground, which is accessible very easily from a top face of the bar, which may represent a sidewall for the submount mounted on the upper surface of the pedestal. Therefore, the bar may be as long as the pedestal submount and/or the upper surface, to provide a ground area with low inductance. Further, the bar or rather the sidewall serves as an electro-magnetic shielding. An electromagnetic field inside the pedestal submount can thus not extent over the pedestal in negative width-direction as it would be possible without the side wall/bar, with the effect, that a metal cap of the transistor outline can be placed closer to the pedestal without an electromagnetic coupling with the cap. In other words, the bar protects the submount on the pedestal from an electromagnetic coupling with a cap. To achieve an improved electromagnetic shielding, the bar and/or the pedestal is made of a solid metallic material. Therefore, the bar improves the submount RF signal path performance. Further, the bar may act as an alignment tool in the pedestal submount assembling process, such that the pedestal submount can be assembled more precise and in particular with a minimum distance to the TEC, DML and/or a cap.

In a preferred embodiment, the first and second pedestal comprise the first bar, which is arranged at the upper surface such that a side face of the first bar extends a first side face of the first and second pedestal. Further, the first and second pedestal comprise a second bar, which is arranged at the upper surface such that a side face of the second bar extends a second side face of the first and second pedestal to form two sidewalls adjacent to the upper surface. A U-shape of the first and second pedestal is formed by the upper surface, which is positioned between the first and second bar. Therefore, a cross-sectional profile along the height and longitudinal direction has a U-shape. In this embodiment, the pedestal provides two bars or rather two sidewalls, wherein each sidewall is preferably positioned at an opposing side of the pedestal, such that the submount can be placed between the sidewalls. Beneficially, both bars and the pedestal may be made of one piece, and in particular of a solid metallic material. That way, the submount or rather an RF line of the submount can be made straight to reduce reflections, which may be generated by bends. Further, the two sidewalls provide an electromagnetic shielding to both sides of the RF line, so that its performance is improved even further. Moreover, no extra ground pad in the middle of the submount is necessary, as the submount can be mounted between two grounds provided by the bars on each side of the submount.

In a beneficial aspect of the invention, the first and second pedestal comprise the first bar, which is arranged at the upper surface such that a side face of the first bar extends a first side face of the first and second pedestal. The first and second pedestal further comprise the second bar, which is arranged at the upper surface such that a side face of the second bar extends a second side face of the first and second pedestal to form two sidewalls adjacent to the upper surface. One bar of each pedestal has a lower length than the other bar, to form a partial U-shape of the first and second pedestal, wherein the upper surface is positioned between the first and second bar. The length of the sidewall or bar is directed perpendicular to the longitudinal and height direction. A first end of the sidewall/bar may be arranged in a distance to an end face of the pedestal, in particular to the free face. However, it is possible, that an end of the sidewall/bar is arranged distanced to the mounting face. In this embodiment, the pedestal comprises two different cross-sectional profiles along the height and longitudinal direction, one, which is U-shaped, and one, which is L-shaped. It is further possible, a distance between an end of the bar and an end face of the pedestal is larger than then the distance between the other end of the bar and the other end face of the pedestal, e.g. a distance between the second end of the bar and the mounting face is smaller than a distance between the first end of the bar and the free face of the pedestal.

With a partial U-shape, the RF signal lines of the submount can be placed closer to the DML, which may be located between the pedestals and the submounts. In particular, the partial U-shape results in a free area between an end of the bar/sidewall and an end face of the pedestal. Preferably, that free area is located between the free face and the first end of the bar so that one end of the signal line of the submount can be placed close to a free edge of the pedestal, where it may be located closer to the DML. In case one or both of the pedestals have a partial U-shape, the header comprises two different pedestals each with a partial U-shape that mirrors the other along the mirror plane parallel to the width and height directions and/or the mirror plane parallel to the longitudinal and height directions. That way, two L-shaped submounts can be placed mirror symmetrically on the upper faces such that the DML is located close to, and between two RF signal lines of the submounts to improve the overall connectivity of the RF signal lines and the DML. On the other hand, due to the partial U-shaped pedestal, the RF signal line of the submount may be protected from interaction with the TEC, in an area close to the TEC.

In another aspect of the partial U-shaped pedestal, the bar may be arranged distanced to both end faces of the pedestal, wherein the first end may be arranged in a distance from the free face and the second end may be arranged in a distance from the mounting face. Preferably, the bar is located centrally between the mounting face and the free face of the pedestal, in particular such that the pedestal is shaped mirror symmetrically with respect to at least a mirror plane parallel to the longitudinal and height direction. In other words, the pedestal comprises two free areas, one at each opposite end of the bar and, in particular between each end of the bar and an end face of the pedestal. That way a U-shaped submount can be placed onto the upper surface, and in particular between two bar and its sidewalls that act as a ground, but at the same time the upper surface, or rather the free area of the upper surface provides the possibility to place the RF signal line of the submount very close to the DML.

According to a further embodiment, the header comprises at least two pedestal submounts, which are mounted on the upper surface of the first and second pedestal. A height of at least one sidewall, in particular, two sidewalls of each pedestal correspond to a height of the pedestal submounts, this especially means, that the height of at least one sidewall is similar to the height of the submount. It may be possible, that the height of both sidewalls of each pedestal correspond to, or is similar to the height of the submount mounted thereon. That way, the RF line of the submount is best protected from an electromagnetic coupling or other interactions to guarantee a good performance. However, the height of at least one sidewall may be slightly larger, e.g. between 0.5% and 10% larger, than the height of the submount to avoid electric and/or magnetic interactions. Further, the height of the first sidewall may be larger or smaller than the height of the second sidewall.

In a further aspect of the invention, a length of the first and second pedestal is larger than a length of the pedestal submounts. That way, there is enough space to arrange one or two bars on the upper surface additionally to the submount. Further, with a length of pedestal larger than the length of the submount, more space for a placement of the submount on the pedestal may be provided to allow a more precise adjustment of the submount. Preferably, the length of the pedestal is defined by a combined length of the upper surface and the width of at least one or both bars, so that the length of the submount, which ideally corresponds to the length of the upper surface fits between the sidewalls of the first and second bar or between the sidewall of one bar and an edge of the upper surface and a side face of the pedestal.

In a preferred embodiment, a height of at least one sidewall is larger than 0.1 mm, preferably larger than 0.2 mm, preferably larger than 0.3 mm and/or smaller than 0.6 mm, preferably smaller than 0.5 mm, preferably smaller than 0.4 mm. As other electric components, such as the submounts typically have a space saving design, a height of the sidewall between 0.1 mm and 0.6 mm is an optimal height to guarantee a good placement of the submount and also a space saving design of the pedestal and its bar to allow other components to be placed on the header and/or in the cap of the TO.

According to a preferred aspect, a width of at least one bar is larger than 0.05 mm, preferably larger than 0.1 mm, preferably larger than 0.15 mm and/or smaller than 0.3 mm, preferably smaller than 0.25 mm, preferably smaller than 0.2 mm. With a small width of between 0.1 mm and 0.3 mm the bar allows a placement of the pedestal and the submount very close to the cap, and the same time guarantees that the RF signal line of the submount is protected from electromagnetic coupling with the cap. A small width of the bar further allows a placement of two pedestals and submounts mounted thereon in a distance far apart from another so that, e.g. an electronic, optic and/or opto-electronic component, which is located between the pedestals can have larger dimensions. An opto-electronic performance may therefore be improved in a TO-design with pedestals that are arranged with a large distance from one another.

The term "electronic component" encompasses, i.e., opto-electronic components. Suitable electronic components in electronic or, in particular, opto-electronic applications may be, but are not limited to, laser diodes (LD), such as electro-absorption modulated laser diodes (EML), distributed feedback laser (DFB), Fabry-perot laser (FP), optical modulators, photodiodes (PD) and other electronic components used for optical communication.

In a beneficial embodiment, the header comprises at least two pins, wherein each pin is arranged in one of the two openings, which are arranged above the first and second pedestal, wherein at least one of the pins comprise at least one of the features: a head face of the pin is arranged flat with the base front face, the pin comprises a nail head.

Both features can improve the electronic and in particular the RF coupling of the pin and the RF signal line of the submount. With a head face of the pin arranged flat with the base front face, the pedestal and/or the submount on the pedestal can be placed closer the to pin, especially, when the pedestal and/or submount is placed at least partially overlapping the opening. Moreover, the submount can be placed more precisely close to the pin, as otherwise it is technically very difficult to place the submount between the pedestal and a pin that protrudes from the base front face. In such a case the production costs will raise. As the RF line of the submount is electronically, acoustically or otherwise connected with a protruding segment of the pin, or rather the head of the pin, a nail head pin generally provides a larger surface for an electronic or acoustic connection with the submount and thus, the use of a nail head pin improves the overall construction and in particular the coupling of the pin and the submount. Further, due to the larger diameter of the nail head pin in comparison with a standard pin, a better impedance matching is achieved in the eyelet.

Generally, at least one, preferably each pin is preferably arranged centrally in the openings and/or a center of the opening is arranged in height direction above a center of the length of each pedestal. Such configuration allows a good electronic coupling of the pin and the RF signal line of a submount mounted on the pedestal, and in particular mounted centered with respect to the length of the pedestal, that extends in longitudinal direction. In a configuration of an L- or U shaped pedestal, the submounts are ideally arranged shifted from the center of the length of the pedestal in longitudinal direction to the one or two bars, which are especially located at the sides of the pedestal and next to the submounts. To keep an efficient coupling of the RF signal line of the submount and the pin, the pedestal is arranged shifted with respect to the pin such that a center of the length of the submount is located below a center of the pin. In other words, independently of the shape of the pedestal, a center of the pin is arranged in height direction below the center of the length of the submount to guarantee an effective electronic coupling or RF coupling of the pin and the RF signal line of the submount. Therefore, the pins may also protrude from the base front face by a distance of between 0.1 mm and 1 mm, ideally between 0.2 mm and 0.6 mm and/or have a diameter between 0.1 mm and 0.4 mm, ideally between 0.2 mm and 0.3 mm.

In a preferred embodiment, a conductor trace of the submount, which is mounted on the upper surface and is electrically connected, in particular by an electrically conducting material to at least one bar, which is part of a coplanar waveguide. A conductor trace of the submount means that the submount comprises at least one RF signal line pad and/or at least one or more ground pads. In this configuration, the sidewall, especially the top face of the bar and a top side of the submount have a similar height, such that the top face of the bar and the top side of a ground pad of the submount are arranged coplanar. As the bar and especially the pedestal are preferably made of a wave guiding material, it forms an optimal ground so that the submounts or rather the ground pads of the submount can are electronically connected. Such a connection may be realized by an application of an electrically conducting material, such as bond wires to ground the submount. As the submount and the top face of the bar are arranged at similar heights and, in particular next to each other, a distance to be connected is very low, with the effect that material costs can be saved and moreover the grounding performance is increased. Moreover, such bond wire connections can serve as via hole replacement and thus a complex and costly via hole production and component adjustment can be avoided.

DESCRIPTION OF THE DRAWINGS

In the following, the invention will be described in more detail with reference to the accompanying drawings.

DETAILED DESCRIPTION

Figure 1:
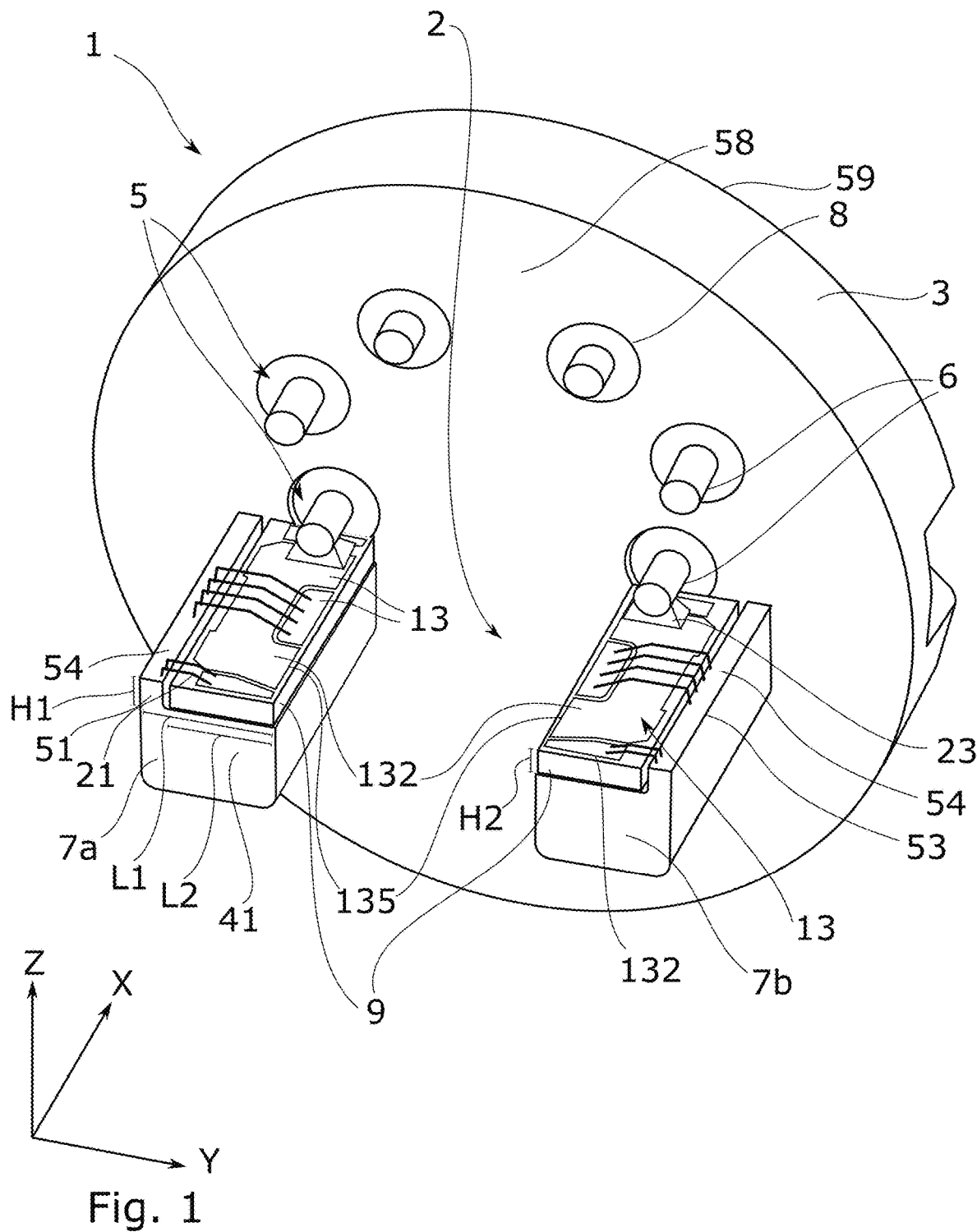
FIG. 1 shows a perspective view of a header with two pedestals.
Figure 2:
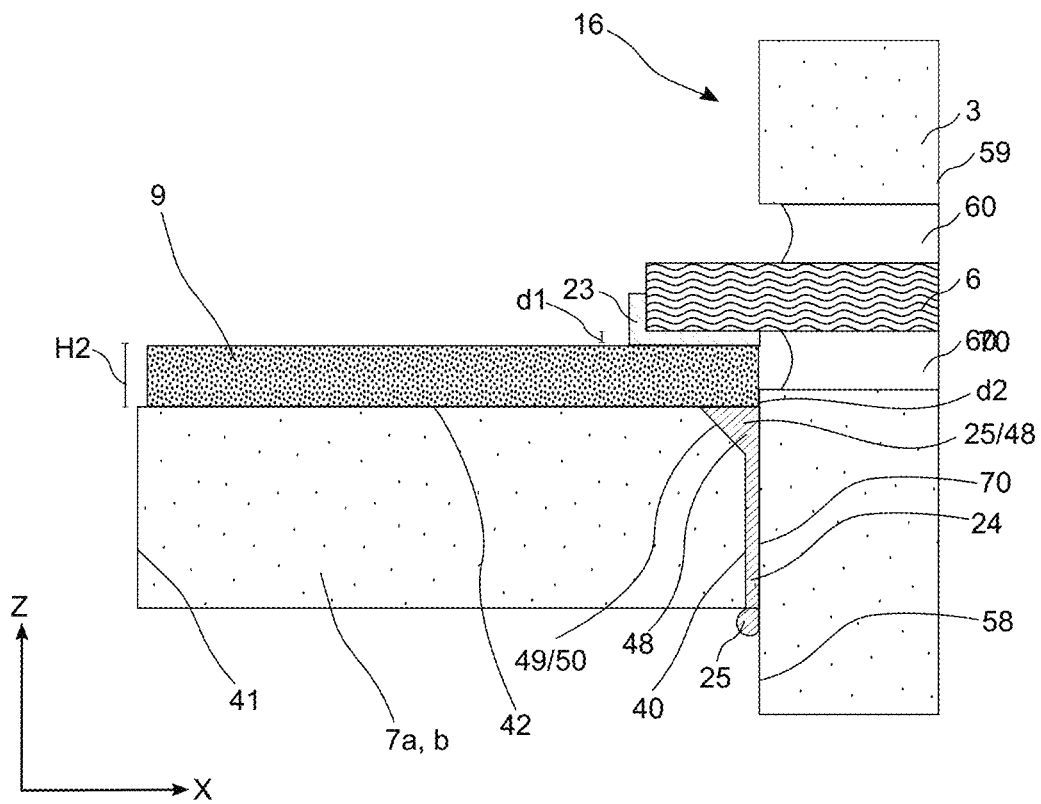
FIG. 2 shows a schematic view of a cross section of a pedestal mounted on the base of the header.

FIGS. 1 and 2. show a header 1 in a perspective view or in a schematic view of a cross section respectively. In both FIGS. 1 and 2, the header 1 is oriented along a width X, a longitudinal direction Y, and a height direction Z. The header 1 comprises a base 3 with a base front face 58 and a base back face 59 and with two or more electrical feedthroughs 5. The feedthroughs serve to transmit electrical signals in or out of the header 1. Each feedthrough 5 comprises a feedthrough pin 6 that extends through the base 3 and is electrically isolated thereto. For this purpose, the base 3 comprises eyelets (or openings) 8 filled with an insulating material 60, preferably glass, in which the feedthrough pin 6 is fixed. Two pedestals 7a, b that are described in more detail in FIG. 3-6 are connected to and protrude from the base 3. Without restriction to the specific example as shown, in a preferred embodiment, the pedestals 7a, b are arranged in a distance with a gap 2 in between. The gap 2 serves to accommodate electronic components, such as a directly modulated Laser (DML), in particular an assembly for carrying the electronic component. On each of the pedestals 7a, 7b, a submount 9 is attached.

Further, an exemplary brazing area 70 of base 3 is depicted. Generally, a brazing area is understood as referring to a portion of a component or part indented or at least suited for being joined to further components or parts at least in a subportion thereof. For example, the surface of a component, that is, a base front face 58 of the base 3 of header 1. Further, it is known to coat or plate surfaces of components to be joined at least partially with metals such as nickel and/or gold. Nickel is known to improve the solderability of, for example, copper, whereas a thin gold layer may be employed in order to avoid the oxidation of the nickel layer. For the header 1, it may be understood that at least in brazing area 70, in which further components may be joined to the base front face 58, the base front face 58 may therefore be at least partially Au-plated (or gold-plated). Of course, it is generally possible that the whole of the surface of base 3 is gold-plated. Further, the base 3, and in particular the base front face 58 may be nickeled at least partially.

At least one of pedestals 7a, 7b, preferably both, or in case header 1 comprises more than the exemplarily depicted pedestals 7a, 7b, all pedestals 7 of header 1 are joined to base 3 via a braze joint 24. The braze joint 24 is understood here to refer to a joint between parts, especially metal parts, that are to be joined in a tight, close connection a precise control of offsets between adjoining parts (or components), such as pedestal 7a, b and base 3 or submount 9 and pin 6. For explanation, reference is now made to FIG. 2. Here, submount 9 is electrically connected to pin 6 via solder joint 23. In the exemplary header 1, the pin 6 is centered in opening 8 of feedthrough 5, however, in general, without being restricted to the exemplary header 1 shown in FIG. 2, the position of a pin 6 in the opening 8 will vary due to production tolerances.

Ideally, an offset between pin 6 and a surface of submount 9 (pin offset, d1) is set between at least 0.05 mm and at most 0.2 mm. However, even if minimizing pin offset d1 might be favorable from a signal bandwidth point of view, as mounting processes should be taken into account, the minimum value of the pin offset is, according to a further preferred embodiment, at least 0.05 mm. This allows to first join pedestal 7a, b to base 3 in a first brazing process and subsequently joining submount 9 to pedestal 7a, b in a further, second brazing process without risking damage to submount 9. Ideally, an offset d2 (submount offset) between a side face or edge of submount 9 and the base front face 58 is set between 0.1 mm and even 0 mm. As a brazing process is used to join pedestal 7 and base 3 that are closely fitting (or matching) parts, the melted braze is drawn into a very small gap between these parts by capillary action. In this way, only a very small amount of excess brazing material 25 may be produced, resulting in only small brazing bulge 25. This further allows for a very tight and close connection with minimal or at least tightly controlled offset between adjoining parts.

The pedestal 7a, b is joined to base 3 (or the surface of base 3) via braze joint 24, located between the base front face 58 and a mounting face 40 of pedestal 7a, b. Further, submount 9 is joined to pedestal 7a, b via a further braze joint (not shown), located between an upper surface 42 of pedestal 7a, b and a back or bottom side of submount 9. Here, the upper surface 42 relates to that side of the pedestal facing the pin 6, and the bottom or back side of submount 9 is understood as referring to the carrier side of submount 9 (in contrast to the component side of submount 9). Pin 6 is electrically connected to submount 9 via solder joint 23. In order to facilitate brazing, the base front face 58 and/or the mounting face 40 of pedestal 7a, b and/or the upper surface 42 of the pedestal 7a, b and/or the back side of submount 9 are Au-plated at least partially in a brazing area thereof. Preferably, at least one of braze joints and/or solder joints comprises gold (Au), germanium (Ge) and/or tin (Sn).

Generally, the submounts 9 are equally formed and are each mounted onto one of the pedestals 7a, b so that respective ends of conductor traces 13 that are connected to the pins 6 ideally face each other. Preferably, a pattern of the structured conductor plating 13 of the submount 9 has a mirror symmetry. This enables to use submounts mounted with different ends pointing towards the base 3 and therewith have the ends 135 of the conductor traces 132 facing each other. This way, e.g. two submounts mounted on the pedestals 7a, b are of the same type but are simply mounted with one of the submounts turned around by 180°. The submounts 9 may have two opposite ends and are mounted with one end facing the base 3 and the other end facing the other submount 9, and wherein a symmetry plane of the mirror symmetrical conductor plating 13 may be located between the ends.

At least one, preferably more than one, e.g. two pedestals 7a, b are formed in a separate manufacturing process than the base, for example, by stamping, metal drawing or extrusion. Because of this, the at least one pedestal 7a, b may be formed with a special, even complex, geometry, for example, with a chamfered edge and/or a back taper and/or a complex shape of the pedestal profile, such as an L-shape or a U-shape. The chamfer and/or blend edge/s may represent back tapers of the pedestal. Without being restricted to the shown exemplary pedestal 7a, b, the pedestal 7a,b may have blend and/or chamfer edges 50, that are arranged at both ends, in particular one edge face 5o adjacent to the upper surface 42 and the mounting face 40 and one edge face 50 adjacent to the upper surface 42 and the free face 41 (not shown here). Thereby, it is possible, that the pedestal 7a, b comprises both, the chamfer edge 50 at one end and the blend edge 50 on the other end. It may also be possible, that the pedestal 7a, b may comprise either the blend or chamfer edge at both ends. Typically, excess brazing material 25 forms a bulge around the profile of the pedestal 7a, b such that the edge 50 may form a reservoir 48 space for accommodating the excess brazing material 25. That way, the submount 9 can be placed flat on the upper surface 42 and directly at, and in particular contacting the base front face 58. In FIG. 1 the pedestals 7a, b have an L-shaped profile with symmetrical submounts mounted in the upper surfaces 42 of the pedestals. Such profiles may be advantageous as they provide stops for the submounts 9 which facilitates positioning thereof. Further, protrusions or bars of the L- or U-shaped pedestals may provide additional screening of the signal path.

Preferably, for the sake of an easy production the pedestals have a cuboid shape with six faces. The pedestal 7a, b therefore comprises a mounting face 40 for mounting or rather for brazing the mounting face 40 with the base front face 58 and a first 43 and second side face 44, as well as a free face 41 opposing the mounting face, an upper surface 42 for accommodating the submount 9 thereon, and a bottom face (not shown). Such embodiment has preferably a rectangular profile, which is in particular symmetrical with respect to at least three mirror planes. In this case, the side of the pedestal 7a, b with the mounting face 40 is plane. Bond wires to ground the conductor plating 13 or rather the submount 9 therefore must go down to the upper surface 42 of the pedestal 7a, b to get in contact with ground. This makes the bond wire longer. This may not be advantageous for very high frequency applications. On the other hand, this design is simple and also allows to use two equal pedestals. This embodiment is particularly suited for applications with lower signal rates to save costs.

As shown in FIG. 1, the pedestal is ideally L-shaped with a bar 51, 53 arranged on the upper surface 42 and extending one of the side faces 43, 44. The bar may comprise a top face 54, a sidewall 55 and a side face 52 (not shown here), wherein the sidewall 55 is ideally arranged facing the submount 9 and in particular a height of the sidewall 55 is equal or at least similar to a height of the submount 9 so that the top face 54 of the bar 51, 53 and the conductor plating 13 are arranged coplanar. A width W1 of the top face 54 of the bar 51, 53 preferably represents the width W1 of the bar 51, 53. Ideally, all faces are arranged in angle between 60° and 130°, especially the upper surface 42 is arranged to the mounting face 40 in angle between 80° and 100° and in particular 90°.

Figure 3A:
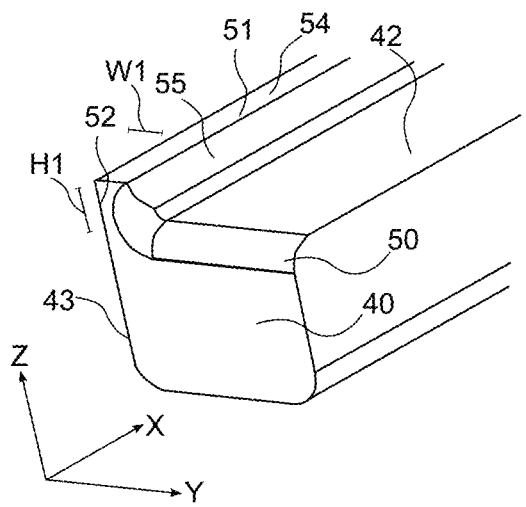
FIG. 3a shows a perspective view of a blend edge of the pedestal.
Figure 3B:
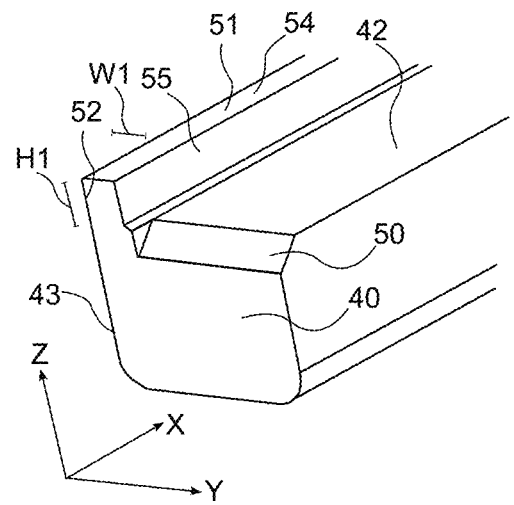
FIG. 3b shows a perspective view of a chamfer edge of the pedestal.

FIG. 3a shows an L-shaped pedestal 7a, b with a blend edge face 50 adjacent to the upper surface 42 and the mounting face 40. Without being restricted to the shown exemplary pedestal 7a, b, the pedestal may have blend edges 50, that are arranged at both ends, in particular one edge face 5o adjacent to the upper surface 42 and the mounting face 40 and one edge face adjacent to the upper surface 42 and the free face 41 (not shown here). Ideally, the face of the blend edge extends to the bar 51, 53 so that a sidewall, which is arranged adjacent to the upper surface 42 and a top face of the bar 51, 53 may also comprise, or is formed as a blend edge. FIG. 3b is similar to FIG. 3a and shows an L-shaped pedestal 7a, b with a chamfer edge face 50 adjacent to the upper surface 42 and the mounting face 40. Without being restricted to the shown exemplary pedestal 7a, b, the pedestal may have chamfer edges 50, that are arranged at both ends, in particular one edge face 5o adjacent to the upper surface 42 and the mounting face 40 and one edge face 50 adjacent to the upper surface 42 and the free face 41 (not shown here).

FIG. 3a, b and FIG. 1 therefore show a pedestal 7 as it is part of the embodiment of FIG. 1. The pedestal 7a, b has two end faces 40, 41. The pedestal 7a, b is mounted to the base 3 with one of its end faces 40 41. The fastening of the pedestal 7 to the base 3 is preferably done by brazing, e.g. using an AuSn-solder. The profile of the pedestal 7a, b has an L-shape due to a sideward protrusion 4 in the form of a rib or bar 51, 53. The protrusion 75 extends laterally along the mounting face 40. Although the profile of the pedestal 7a, b is not symmetric, the pedestal 7a, b has a mirror symmetry with a mirror plane extending between the two end faces 40, 41 and parallel to the width X and height direction Z. This symmetry feature may be similar to that of the submounts 9. Thus, without restriction to the specific profile of the embodiment of FIGS. 1, 3a and 3b, a preferred embodiment of the header 1 is based on the features that two equal pedestals 7a, b are provided, each of the pedestals 7a, b carrying one of the submounts 9, wherein the pedestals 7a, b on the base 3 have a mirror symmetry. Further, similarly to the orientation of the submounts 9, one of the pedestals 7a is attached to the base 3 with one end face 40 and the other pedestal 7b is attached to the base 3 with the opposite end face 41. As both the pedestals 7a, b and the submounts 9 may be mounted with respective opposite sides facing the base 3, it is possible—as shown in FIG. 1—to assemble the submounts 9 and pedestals 7a, b to obtain equal submount assemblies and the fasten the submount 9 assemblies with respective opposite end faces to the base 3.

In a preferred embodiment, the bar 51, 53 may have the same height H1 as the submount 9/H2, or the ratio of the height H1 of the bar 51, 53 to the height H2 of the submount 9 is between 0.5 and 1.5. The height H1 of the protrusion is preferably between 0.1 mm and 0.5 mm. A typical height is about 0.2 mm. The width of the protrusion may be between 0.1 mm and 0.3 mm. A typical width is 0.175 mm. The L-shaped profile has several advantages. The ground is accessible easily from a top side of the pedestal submount 9. Because the bar is of solid metal and is as long as the pedestal submount 9 itself, this ground area has low inductance and is therefore preferred for RF application. Further, the bar 51, 52 serves as an electro-magnetic shielding. The EM-Field inside the pedestal submount 9 cannot extent over the pedestal 7a, b in negative Y-direction, as it is possible without sidewall 55.

Figure 4:
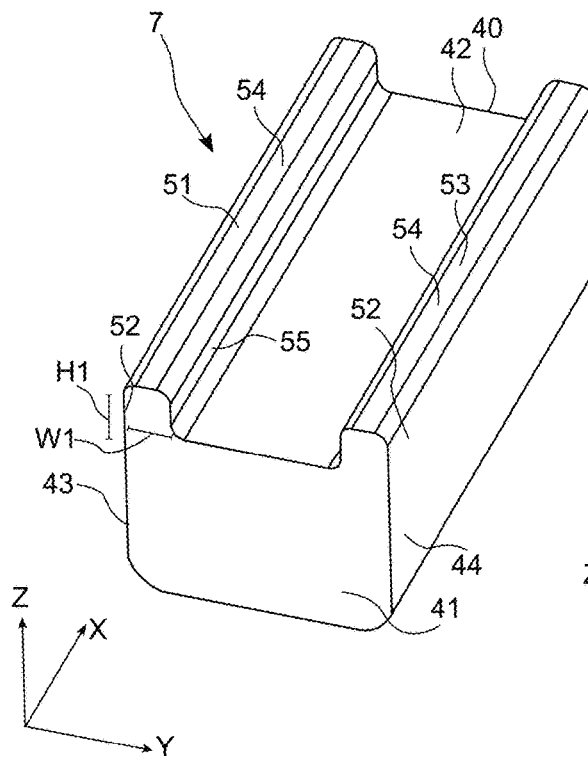
FIG. 4 shows a perspective view of a U-shaped pedestal.

FIG. 4 shows an alternative embodiment of a pedestal 7a, b. In difference to the embodiment of FIGS. 1 and 3a, b, this embodiment has a U-shaped profile with bars 51, 52 extending along opposite side faces 43, 44 of the upper surface 42. According to one embodiment, which is also realized by the U-shaped profile, the pedestal 7a, b may generally have a mirror symmetric profile. At least one mirror plane in this case extents parallel to the bar 51, 53 through the center of the profile and parallel to the width X and height Z direction. Another mirror plane extends parallel to the longitudinal Y and height Z direction. In this case with a double mirror symmetry, the pedestals 7a, b can be attached to the base 3 with either of the end faces 40, 41 without altering the design.

As also in the example of FIGS. 1 and 3a, b, these bars 51, 53 may serve to provide a ground-signal-ground configuration as well. Specifically, in the embodiment with the L-shaped profile (FIG. 1, 3a, b) of the pedestal 7a, b, the bar 51, 53 is a grounded conductor which flanks the side of a C-shaped conductor trace 132 which is opposite to the side facing a d-shaped conductor trace. In the embodiment of FIG. 4, the signal conductor trace 132 may be flanked on both sides by the sidewalls 55 of the bars 51, 53, which are electrically grounded.

Figure 5:
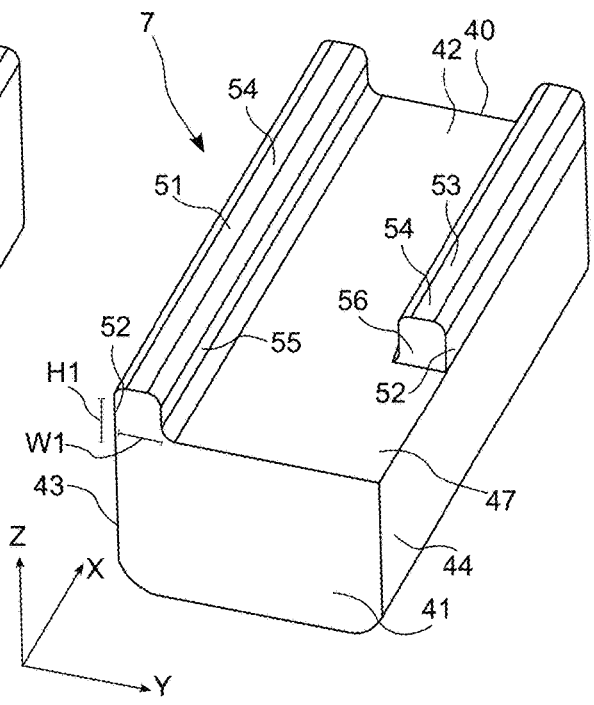
FIG. 5 shows a perspective view of a partial U-shaped pedestal with a long bar.

FIG. 5 shows an embodiment of a pedestal 7a, b having a L-shaped profile at end 40 and a U-shaped profile at the opposite end 40 and thus having a partial U-shape. The different profiles result from one of the bars 53 being shorter than the bar 51. Due to this design, the upper surface 42 may be also L-shaped, with a free area 74 between the free face 41 and a first end of the bar 56. Therefore an L-shaped submount 9 fits to the L-shaped upper surface 42 of the pedestal 7a, b. This allows to fabricate left and right pedestals 7a, b and left and right submounts 9 as equal parts.

Specifically, on both opposite faces of the carrier of the submount a structured conductive plating 13 may be arranged, wherein the conductive platings 13 have a mirror symmetry with a symmetry plane extending centered between the sides of the submount 9, or the carrier, respectively. Of course, this feature is not restricted to the particular L-shaped design. Rather, a front- and backside-plating may be present at all embodiments of submounts 9 disclosed herein.

Figure 6:
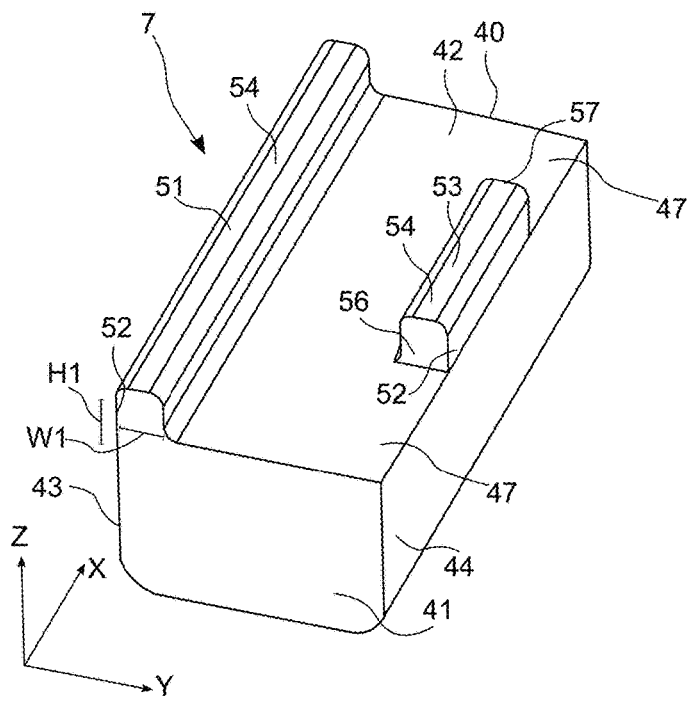
FIG. 6 shows a perspective view of a partial U-shaped pedestal with a short bar.

However, as shown in FIG. 6 to realize a symmetric partial U-shape of the pedestal 7*a*, *b*, which is symmetrical along at least two mirror planes, one parallel to the height Z and longitudinal Y direction and one parallel to the width X and height Z direction, the shorter bar 53 may be arranged with a first 56 and a second end 57 distanced from both ends 40, 41 of the pedestal 7*a*, *b*. Beneficially, the shorter bar 53 is arranged centered between both ends 40, 41 of the pedestal 7*a*, *b*. In this case, the submount can be fabricated also symmetrical with a U-shaped profile and thus avoiding the costly production of different components.

Figure 7:
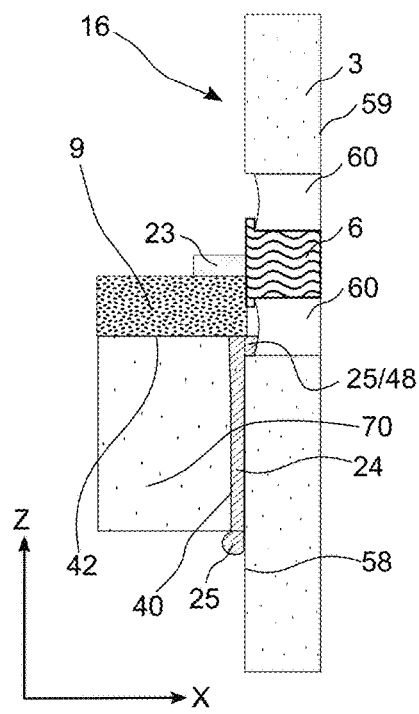
FIG. 7 shows a schematic view of a cross section of a pedestal mounted on the base of the header with a nail head pin.

FIG. 7 shows an alternative embodiment of a header 1, pin 6, pedestal 7*a*, *b* and submount 9 assemblage, which is similar to that shown in FIG. 2. However, the pin 6 comprises a nail head, which is arranged flat or coplanar with the base front face 58. The nail head pin 6, especially the nail head provides a much larger contact area for the submount 9 and/or the solder of the solder joint 23. In this example, the pedestal 7*a*, *b* is arranged at least partly overlapping the opening 8, which is at least partly filled with insulating material 60. A potential reservoir 48 for excess brazing material 25 is formed at least partly in the opening and, in particular in an overlapping area between the pedestal mounting face 40 and the insulating material 60. In this configuration, the submount 9 can be placed very precisely and very close, in particular almost in direct contact to the pin, so that the RF and/or electronic performance can be maximized. Furthermore, less costly soldering material is needed for the connection of the pin and the submount 9.

LIST OF REFERENCE SYMBOLS

1 header
2 gap
3 base of 1
5 electrical feedthrough
6 feedthrough pin
7 pedestal
7*a* first pedestal
7*b* second pedestal
8 eyelet/openings
9 pedestal submount
13 conductor plating
21 bond wire connection
23 solder joint
24 braze joint
25 excess brazing material
40 mounting face
41 free face
42 upper surface
43 first side face
44 second side face
47 free area
48 reservoir
49 edge
50 edge face
51 first bar
52 side face of the bar
53 second bar
54 top face of the bar
55 sidewall
56 first end of the bar
57 second end of the bar
58 base front face
59 base back face
60 insolating material
70 brazing area
132 conductor trace
135 end of conductor tracing
d1 pin offset
d2 submount offset
H1 height of the sidewall
H2 height of the pedestal submount
W1 width of the bar
X width direction
Y longitudinal direction
Z height direction

What is claimed is:

1. A header for optoelectronic applications, comprising:
   a header base extending in a height direction, a width direction, and a longitudinal direction, the header base having a base back face, a base front face, and at least two openings that extend from the base back face through the header base along the width direction to the base front face;
   a pin fixed in each of the openings so that the pin is electrically isolated from the header base;
   a first pedestal and a second pedestal arranged at the base front face, the first and the second pedestal being arranged mirror symmetrically with respect to an imaginary plane parallel to the height direction and the width direction, the first pedestal and the second pedestal being below, in the height direction, a center of one of the openings, the first pedestal and the second pedestal each comprising a pedestal mounting face, a pedestal free face that is opposite the pedestal mounting face, and an upper surface, the upper surface being sized and configured for mounting and carrying a pedestal submount, wherein the pedestal upper surface faces the respective pin,
   wherein the pedestal mounting faces are fixedly attached to the base front face with an electrically conductive material that is at least partially arranged between the base front face and the pedestal mounting faces,
   wherein each pedestal comprises a bar arranged on the upper surface thereof and directed perpendicular to the longitudinal and height direction and the bar extending along one of the side faces of the pedestal to form a sidewall adjacent to the upper surface, wherein a L-shape of each of the first and second pedestal is formed by the first bar and the upper surface of the pedestal.

2. The header of claim 1, wherein the upper surface of the first pedestal is connected to the pedestal free face and/or the pedestal mounting face by an edge, wherein the edge is adjacent to and between the upper surface and the pedestal mounting face and/or the pedestal free face.

3. The header of claim 2, wherein the edge is a chamfer edge or a blend edge.

4. The header of claim 1, further comprising a second pedestal, a first bar, and a second bar, wherein the first bar is arranged such that a side face of the first bar extends a first side face of the first and second pedestals, wherein the second bar is arranged such that a side face of the second bar extends a second side face of the first and second pedestals to form two sidewalls adjacent to the upper surface and such that the first and second bars and the upper surface of the first and second pedestals form a U-shape, respectively.

5. The header of claim 1, further comprising a second pedestal, a first bar, and a second bar, wherein the first bar is arranged such that a side face of the first bar extends a first side face of the first and second pedestals, wherein the second bar is arranged such that a side face of the second bar extends a second side face of the first and second pedestals to form two sidewalls adjacent to the upper surface, wherein one of the first and second bars has a lower length than the other of the first and second bars to form a partial U-shape of the first and second pedestals, wherein the upper surface is positioned between the first and second bars.

6. The header of claim 1, further comprising two pedestal submounts mounted on the upper surface of the first and second pedestals, wherein the first and second pedestals each have a sidewall with a height in the height direction that corresponds to a height of the two pedestal submounts.

7. The header of claim 6, wherein the first and second pedestals each have a pair of side sidewalls.

8. The header of claim 6, wherein the first and second pedestals have a length in the longitudinal direction that is larger than a length of the two pedestal submounts.

9. The header of claim 6, wherein the height of the sidewall is larger than 0.1 mm and smaller than 0.6 mm.

10. The header of claim 5, wherein the first and/or second bar has a width in the width direction that is larger than 0.05 mm and smaller than 0.3 mm.

11. The header of claim 5, wherein at least one of the first and second pedestal submounts comprises a conductor trace electrically connected to at least one of the first and second bars, wherein the conductor trace is part of a coplanar waveguide.

12. The header of claim 1, further comprising:
a second opening that extends from the base back face through the header base along the width direction to the base front face;
a second pin fixed in the second opening so that the second pin is electrically isolated from the header base; and
a second pedestal arranged at the base front face, the second pedestal being below, in the height direction, a center of the second opening.

13. The header of claim 12, wherein the pin and/or the second pin comprise a feature selected from a group consisting of: a head face arranged flat with the front face and a head shaped as a nail head.

14. A header for optoelectronic applications, comprising:
a header base extending in a height direction, a width direction, and a longitudinal direction, the header base having a base back face, a base front face, and an opening that extends from the base back face through the header base along the width direction to the base front face;
a pin fixed in the opening so that the pin is electrically isolated from the header base;
a first pedestal arranged at the base front face, the first pedestal being below, in the height direction, a center of the opening, the first pedestal comprises a pedestal mounting face, a pedestal free face that is opposite the pedestal mounting face, and an upper surface, the upper surface being sized and configured for mounting and carrying a pedestal submount, wherein the pedestal mounting face is fixedly attached to the base front face with an electrically conductive material that is at least partially arranged between the base front face and the pedestal mounting face; and
a second pedestal, a first bar, and a second bar, wherein the first bar is arranged such that a side face of the first bar extends a first side face of the first and second pedestals, wherein the second bar is arranged such that a side face of the second bar extends a second side face of the first and second pedestals to form two sidewalls adjacent to the upper surface and such that the first and second bars and the upper surface of the first and second pedestals form a U-shape, respectively.

15. A header for optoelectronic applications, comprising:
a header base extending in a height direction, a width direction, and a longitudinal direction, the header base having a base back face, a base front face, and an opening that extends from the base back face through the header base along the width direction to the base front face;
a pin fixed in the opening so that the pin is electrically isolated from the header base;
a first pedestal arranged at the base front face, the first pedestal being below, in the height direction, a center of the opening, the first pedestal comprises a pedestal mounting face, a pedestal free face that is opposite the pedestal mounting face, and an upper surface, the upper surface being sized and configured for mounting and carrying a pedestal submount, wherein the pedestal mounting face is fixedly attached to the base front face with an electrically conductive material that is at least partially arranged between the base front face and the pedestal mounting face; and
a second pedestal, a first bar, and a second bar, wherein the first bar is arranged such that a side face of the first bar extends a first side face of the first and second pedestals, wherein the second bar is arranged such that a side face of the second bar extends a second side face of the first and second pedestals to form two sidewalls adjacent to the upper surface, wherein one of the first and second bars has a lower length than the other of the first and second bars to form a partial U-shape of the first and second pedestals, wherein the upper surface is positioned between the first and second bars.

* * * * *